(12) United States Patent
Wang et al.

(10) Patent No.: US 10,950,651 B2
(45) Date of Patent: Mar. 16, 2021

(54) PHOTODIODE (PD) ARRAY WITH INTEGRATED BACK-SIDE LENSES AND A MULTI-CHANNEL TRANSCEIVER MODULE IMPLEMENTING SAME

(71) Applicant: Applied Optoelectronics, Inc., Sugar Land, TX (US)

(72) Inventors: Hsiu-Che Wang, Rosenberg, TX (US); Elsie Marentes, Katy, TX (US); Qin Li, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 16/202,813

(22) Filed: Nov. 28, 2018

(65) Prior Publication Data

US 2020/0168655 A1    May 28, 2020

(51) Int. Cl.
| | |
|---|---|
| *H04B 10/00* | (2013.01) |
| *H01L 27/146* | (2006.01) |
| *H01L 25/16* | (2006.01) |
| *G02B 27/09* | (2006.01) |
| *G02B 6/293* | (2006.01) |
| *G02B 6/12* | (2006.01) |

(52) U.S. Cl.
CPC .... *H01L 27/14643* (2013.01); *G02B 6/12011* (2013.01); *G02B 6/2938* (2013.01); *G02B 27/0955* (2013.01); *H01L 25/167* (2013.01)

(58) Field of Classification Search
CPC ........ H04B 10/40; H04B 10/60; H04B 10/66; H04B 10/572; H04B 10/671; H04J 14/02; G02B 6/4246; G02B 6/4292; G02B 6/4281; G02B 6/4249; G02B 6/4256; G02B 6/4238; G02B 6/4239; G02B 6/4204; G02B 6/2938
USPC ......... 398/135, 136, 137, 138, 164, 79, 158, 398/159, 85, 87, 88, 202, 208, 212, 213, 398/214, 82; 385/88, 89, 90, 92, 93, 24, 385/37, 14

See application file for complete search history.

(56) References Cited

U.S. PATENT DOCUMENTS

| | | | |
|---|---|---|---|
| 7,539,366 B1 * | 5/2009 | Baks .................... | G02B 6/4201 385/14 |
| 9,869,833 B2 * | 1/2018 | Wang .................. | H01L 31/0203 |
| 10,432,339 B2 * | 10/2019 | Kawamura ......... | H04J 14/0261 |
| 10,447,405 B2 * | 10/2019 | Kang ................... | H04B 10/675 |
| 2014/0169389 A1 * | 6/2014 | Kim ..................... | G02B 6/4204 370/536 |

(Continued)

*Primary Examiner* — Hanh Phan
(74) *Attorney, Agent, or Firm* — Grossman Tucker Perreault & Pfleger, PLLC; Norman S. Kinsella (57) ABSTRACT

The present disclosure is generally directed to an optical transceiver that includes a multi-channel on-board ROSA arrangement that includes an optical demultiplexer, e.g., an arrayed waveguide grating (AWG) and an array of photodiodes disposed on a same substrate. The array of photodiodes may be optically aligned with an output port of the optical demultiplexer and be configured to detect channel wavelengths and output a proportional electrical signal to an amplification circuit, e.g., a transimpedance amplifier. Each of the photodiodes can include an integrated lens configured to increase the alignment tolerance between the demultiplexer and the light sensitive region such that relatively imprecise bonding techniques, e.g., die bonding, may be utilized while still maintaining nominal optical power.

17 Claims, 6 Drawing Sheets

(56) References Cited

U.S. PATENT DOCUMENTS

2014/0346323 A1* 11/2014 Fujimura .................. G01J 1/44
                                                        250/208.2
2015/0256259 A1*  9/2015 Huang .................. G01J 1/0271
                                                         398/88

* cited by examiner

PHOTODIODE (PD) ARRAY WITH INTEGRATED BACK-SIDE LENSES AND A MULTI-CHANNEL TRANSCEIVER MODULE IMPLEMENTING SAME

TECHNICAL FIELD

The present disclosure relates to optical communications and more particularly, to a photodiode array having a plurality of photodiode chips each having an integrated lens to increase a respective light-sensitive region to provide increased tolerance during alignment processes.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher speeds in smaller optical transceiver modules for a lower cost has presented challenges, for example, with respect to thermal management, insertion loss, and manufacturing yield.

Optical transceiver modules generally include one or more transmitter optical subassemblies (TOSAs) for transmitting optical signals and one or more receiver optical subassemblies (ROSAs) for receiving optical signals. In general, TOSAs include one or more lasers to emit one or more channel wavelengths and associated circuitry for driving the lasers. In general, ROSAs include a demultiplexer and one or more lenses. Some existing optical transceiver modules support up to four (4) channels for sending and receiving of optical signals. Significant technical challenges inhibit the design and manufacture of optical transceiver modules with greater than four channels.

BRIEF DESCRIPTION OF THE DRAWINGS

These and other features and advantages will be better understood by reading the following detailed description, taken together with the drawings wherein.

DETAILED DESCRIPTION

As discussed above, significant challenges limit increased channel configurations of optical transceiver modules beyond four (4) channels. One such limitation includes the availability of transimpedence amplifier (TIA) chips with more than four channels for input/output. Therefore, designs that seek to operate with, for instance, eight (8) channels must include at least two 4-channel arrayed waveguide gratings (AWGs), at least two 1×4 PD arrays, and two TIA 4-channel chips for purposes of receiving and amplifying optical signals. This duplication of components, AWGs, TIAs, and so on, can increase per-unit costs and introduce non-trivial optical alignment issues that can ultimately reduce yield. For instance, die bonding can have a ±10 micron tolerance while a demultiplexer can have a relatively small tolerance of only ±7 microns when coupling to a photodiode with a 20 micron light sensitive region. This disparity can make optical alignment between a photodiode and demultiplexer difficult to achieve in a consistent manner, which can ultimately reduce yield. In addition, photodiodes must be disposed relatively close to TIAs to reduce interconnect latencies such as time of flight (ToF). This close proximity can introduce the potential for damage of fragile components, such as wire bonds, during manufacturing as the space between adjacent TIAs and respective photodiodes is measured in the microns.

The present disclosure is generally directed to an optical transceiver that includes a multi-channel on-board ROSA arrangement that can accommodate more than four channel wavelengths. In an embodiment, the on-board ROSA includes at least an 8-channel optical demultiplexer, e.g., an arrayed waveguide grating (AWG), and an 1×8 array of photodiodes disposed on a same substrate. The array of photodiodes may be optically aligned with an output port of the optical demultiplexer and be configured to detect channel wavelengths and output a proportional electrical signal to an associated amplification circuit, e.g., a transimpedance amplifier (TIA). Each of the photodiodes can include an integrated lens configured to increase the alignment tolerance between the demultiplexer and a light sensitive region of each photodiodes such that relatively imprecise bonding techniques, e.g., die bonding, may be utilized while still maintaining nominal optical power. This may advantageously allow, for instance, an AWG to be coupled to the same substrate as the photodiodes regardless of tolerance disparities.

As used herein, "on-board" in the context of a ROSA arrangement includes direct or indirect coupling of ROSA components to a common substrate. The components of the ROSA arrangement may be coupled to the same surface, or different surfaces of the same substrate. Likewise, the TOSA components may be coupled to the same or different surfaces of the substrate. In some cases, the substrate may include multiple pieces/segments, and this disclosure is not intended to be limited to a single substrate.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. This disclosure is equally applicable to coarse wavelength division multiplexing (CWDM). In one specific example embodiment, the channel wavelengths are implemented in accordance with local area network (LAN) wavelength division multiplexing (WDM), which may also be referred to as LWDM. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated characteristic. To provide one non-limiting numerical example to quantify "substantially," minor variation may cause a deviation of up to and including ±5% from a particular stated quality/characteristic unless otherwise provided by the present disclosure.

Figure 1:
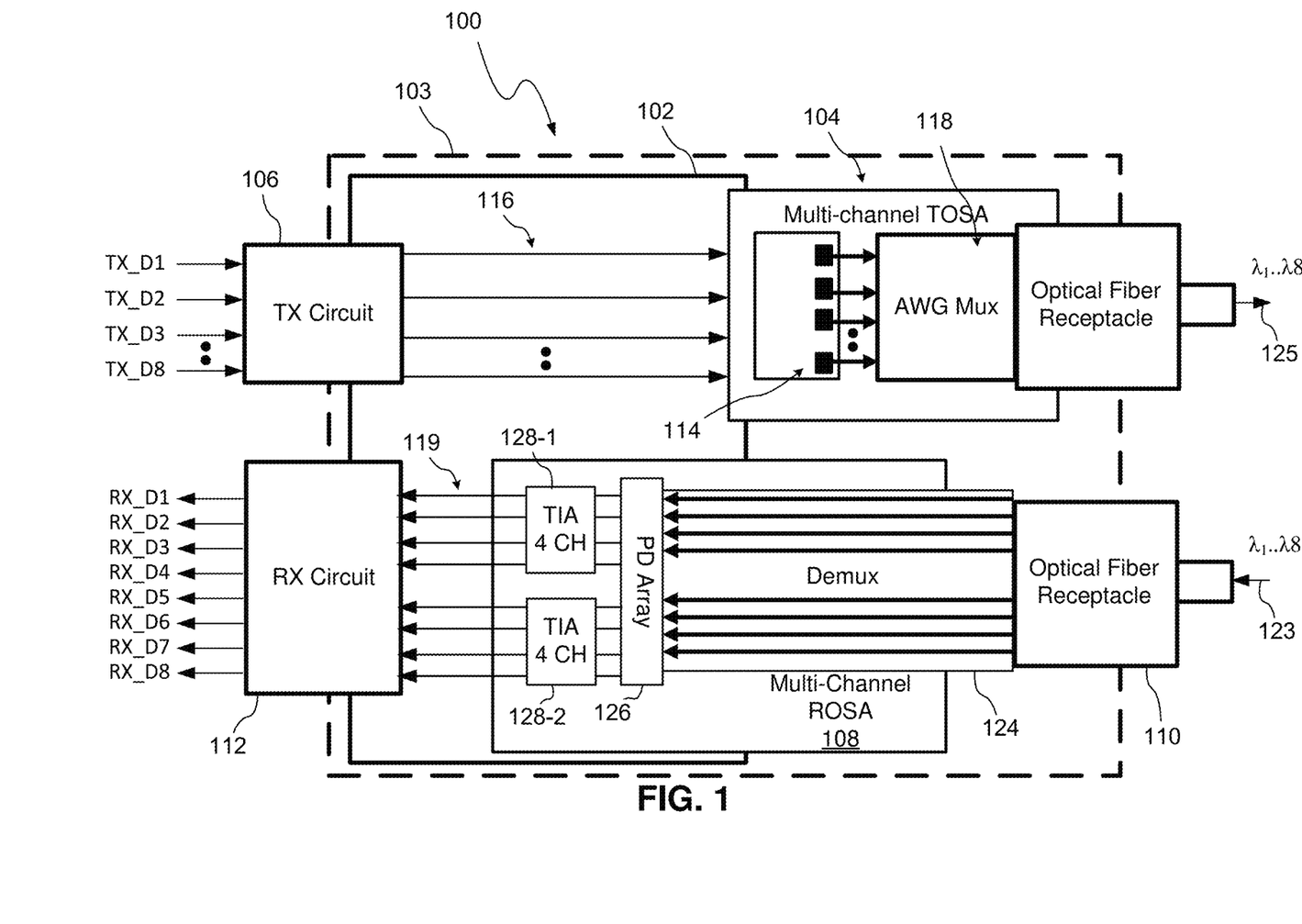
FIG. 1 is a block diagram of a multi-channel optical transceiver, consistent with embodiments of the present disclosure.

Referring to the Figures, FIG. 1 illustrates an optical transceiver module 100, consistent with embodiments of the present disclosure. The optical transceiver module 100 is shown in a highly simplified form for clarity and ease of explanation and not for purposes of limitation. In this embodiment, the optical transceiver module 100 transmits and receives eight (8) channels using eight different channel wavelengths ($\lambda 1 \ldots \lambda 8$) and may be capable of transmission rates of at least about 25 Gbps per channel. In one example, the channel wavelengths $\lambda 1, \lambda 2, \lambda 3, \lambda 4, \lambda 5, \lambda 6, \lambda 7, \lambda 8$ may be 1273 nm, 1277 nm, 1282 nm, 1286 nm, 1295 nm, 1300 nm, 1304 nm and 1309 nm respectively. Other channel wavelengths are within the scope of this disclosure including other wavelengths associated with local area network (LAN) wavelength division multiplexing (WDM). The optical transceiver 100 may also be capable of transmission distances of 2 km to at least about 10 km. The optical transceiver 100 may be used, for example, in internet data center applications or fiber to the home (FTTH) applications.

In an embodiment, the optical transceiver module 100 is disposed in a transceiver housing 103. The transceiver housing 103 can be configured with one or more cavities, e.g., cages or slots, to receive one or more optical transceiver modules, depending on a desired configuration. In an embodiment, the optical transceiver module 100 is configured as a pluggable module.

The optical transceiver module 100 may include a number of components to support transceiver operations. The optical transceiver module 100 may include an optical transceiver substrate 102, a transmitter optical subassembly (TOSA) arrangement 104 for transmitting optical signals on different channel wavelengths, transmit connecting circuit 106, a multi-channel receiver optical subassembly (ROSA) arrangement 108 for receiving optical signals on different channel wavelengths, an optical fiber receptacle 110 to receive and align a fiber connector (e.g., a ferrule) with the ROSA arrangement 108, and a receiver connecting circuit 112.

The optical transceiver substrate 102 may be manufactured from a multi-layer printed circuitry board (PCB), although other types of substrates may be utilized and are within the scope of this disclosure. In one embodiment, the substrate comprises a PCB assembly (PCBA). The optical transceiver substrate 102 includes traces, connector pads, and other circuitry to support transceiver operations. The optical transceiver substrate 102 may include TOSA connector pads 214 (e.g., see FIG. 2) that enable the TOSA arrangement 104 to mount and electrically couple to the optical transceiver substrate 102. The optical transceiver substrate 102 may include traces 116 that couple the TOSA connector pads 214 to the transmit connecting circuit 106. The optical transceiver substrate 102 may further include traces 119 that electrically couple the ROSA arrangement 108 to the receiver connecting circuit 112.

The TOSA arrangement 104 may be configured to receive driving electrical signals (TX_D1 to TX_D8), convert the electrical signals to a multiplexed optical signal (e.g., a signal with channel wavelengths $\lambda 1 \ldots \lambda 8$) by way of an arrayed waveguide grating (AWG) 118. In turn, the AWG 118 outputs a multiplexed optical signal by way of transmit optical fiber 125 having channel wavelengths $\lambda 1 \ldots \lambda 8$. Note while examples and scenarios disclosed herein includes eight (8) channel wavelengths, this disclosure is not limited in this regard and other channel configurations, e.g., 6, 12, 20, and 24-channels, are within the scope of this disclosure.

The TOSA arrangement 104 includes a plurality of laser diode devices 114 and supporting circuitry. Each laser diode device 114 can electrically couple to the substrate 102 via TOSA connector pads 214 and be configured to output a different channel wavelength. The laser diode devices of the TOSA arrangement 104 may include distributed feedback lasers (DFBs), Vertical External-cavity Surface-emitting lasers (VECSEL) or other suitable laser devices.

As further in shown FIG. 1, the multi-channel ROSA arrangement 108 includes an optical demultiplexer 124, a photodetector array 126 (e.g., photodiodes), and first and second trans-impedance amplifiers (TIAs) 128-1, 128-2 for amplifying and converting optical signals into electrical signals. The multi-channel ROSA arrangement 108 may be disposed on the substrate 102 in an on-board configuration, whereby each component is coupled to and supported by the substrate 102.

Continuing on, the optical demultiplexer 124 of the on-board ROSA configuration shown in FIG. 1 can comprise an arrayed waveguide grating (AWG) that is configured to receive an optical signal and separate the same into eight different channel wavelengths. The ROSA arrangement 108 can further include a PD array 126 that accommodates the output of the optical multiplexer 118 by having a plurality of PD devices individually mounted to a common submount and aligned with respective output ports, as discussed in greater detail below. Thus, the PD array may be configured in a 1×8 array, although other channel configurations with more or less than eight (8) channels are within the scope of this disclosure. The PD array 126 may then be electrically coupled to the first and second TIAs 128-1, 128-2 such that electrical signals representative of four channel wavelengths are provided to the first TIA 128-1 and the electrical signals representative of the remaining four channel wavelengths are provided to the second TIA 128-2.

In operation, the optical demultiplexer 124 receives the optical signal from the receive optical fiber 123 and then provides separated channel wavelengths from the same to the array of photodiodes 126. In turn, the array of photodiodes 126 converts the received channel wavelengths into an electrical signal and provides the same to the first and second TIAs 128-1, 128-2. The TIAs 128-1, 128-2 then amplify and provide the receiver connecting circuit 112 with electrical signals (RX_D1 to RX_D8) corresponding to the received channel wavelengths. The receiver connecting circuit 112 is electrically connected to the electronic components (e.g., TIA) in the ROSA arrangement 108. The receiver connecting circuit 112 can include conductive paths to provide electrical connections and may also include additional circuitry.

Referring to FIGS. 2-6 an embodiment of an example transceiver module 200 is shown. As shown, the optical transceiver module 200 includes a substrate 202. The substrate 202 includes a first end 203 that extends to a second end 204 along a longitudinal axis 250. The substrate 202 further includes at least a first mounting surface 245 disposed opposite a second mounting surface 246.

As further shown, a ROSA arrangement 208 is disposed on the first mounting surface 245 proximate the first end and includes an on-board or integrated configuration as discussed in greater detail below. In addition, a TOSA arrangement 206 is coupled to the first end of the substrate 202 and includes a plurality of laser assemblies and optical connectors for outputting a plurality of channel wavelengths. The TOSA arrangement 206 may be edge mounted to the substrate 202, as shown. The substrate 202 may comprise, for example, a printed circuit board assembly (PCBA) or other suitable substrate material.

Figure 2:
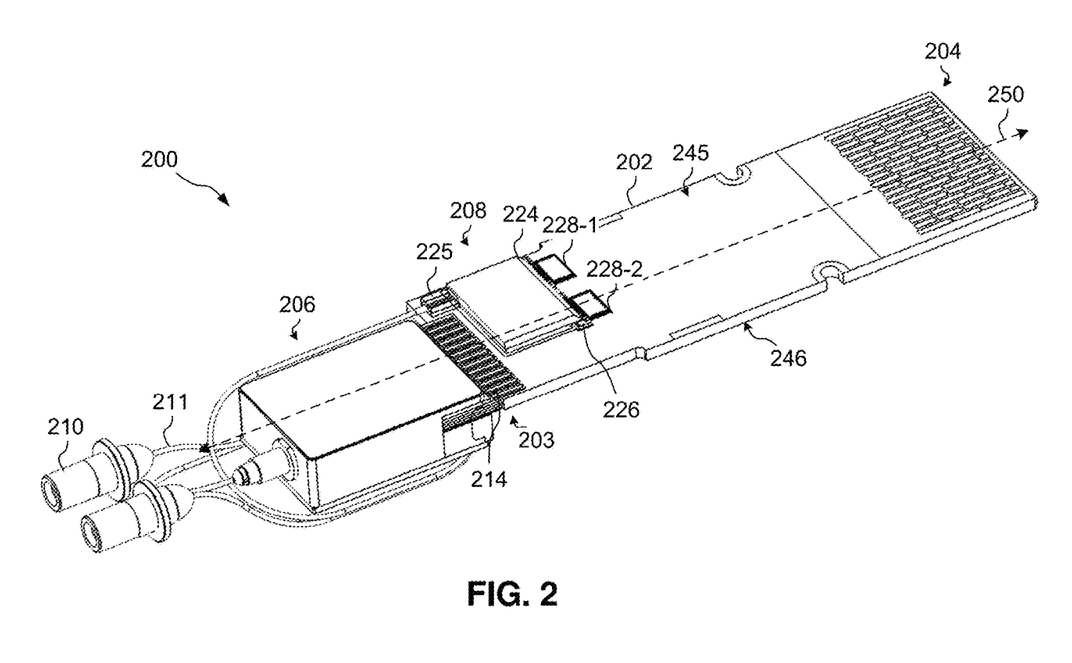
FIG. 2 is a perspective view of a multi-channel optical transceiver module consistent with the present disclosure.
Figure 3:
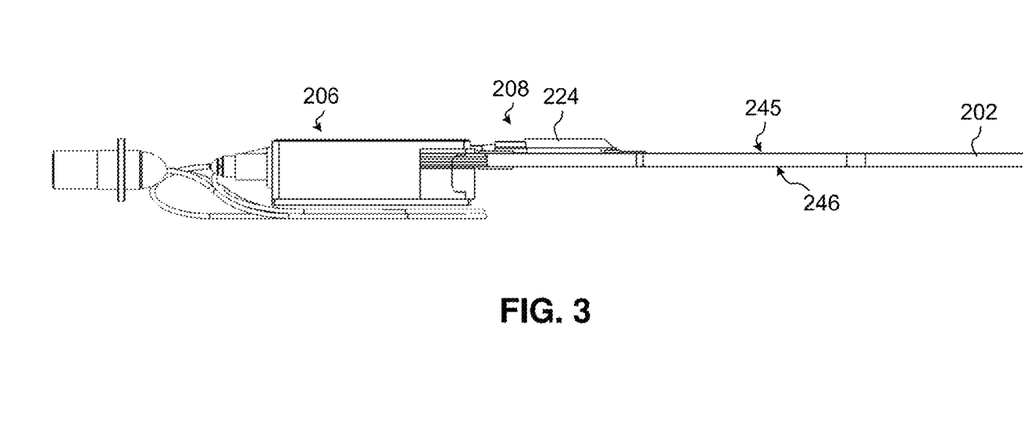
FIG. 3 is a side view of the multi-channel optical transceiver module of FIG. 2, consistent with an embodiment of the present disclosure.
Figure 4:
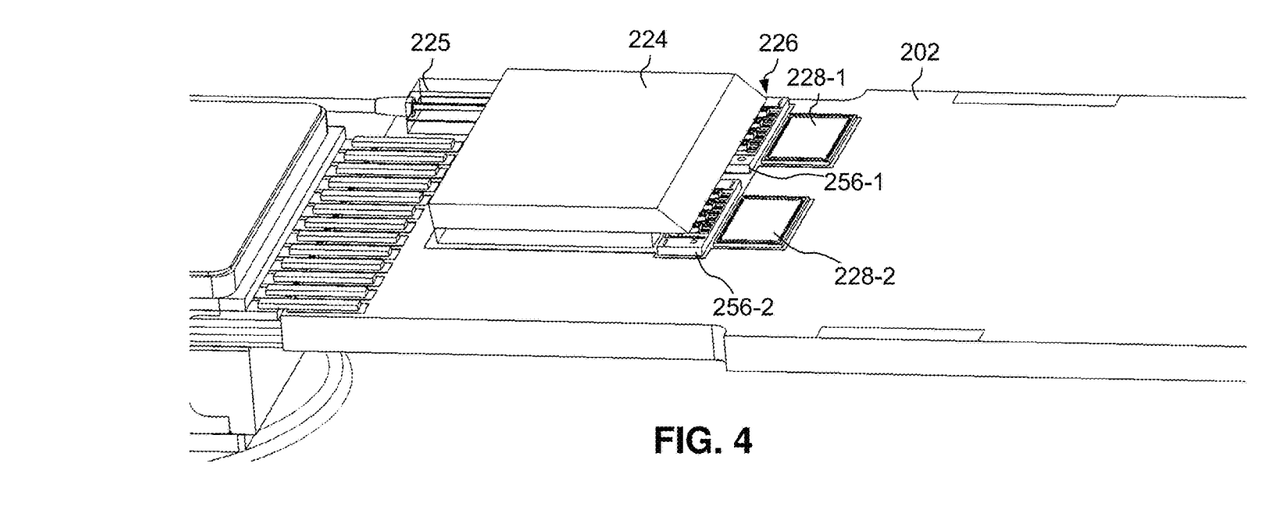
FIG. 4 is a perspective view of an on-board receiver optical subassembly (ROSA) arrangement of the multi-channel optical transceiver module of FIG. 2, consistent with an embodiment of the present disclosure.

The ROSA arrangement 208 includes an optical fiber receptacle 210, an intermediate waveguide 211, an input port 225, a demultiplexer 224, an array of photodiodes 226 (shown more clearly in FIGS. 4 and 6), and first and second TIAs 228-1, 228-2. Each of the components of the ROSA arrangement 208 may be coupled (e.g., directly) to the first mounting surface 245 of the substrate 202. The substrate 202 may therefore underlie and support each of the components for mounting purposes. This may advantageously increase the total surface area for heat dissipation during operation of the optical transceiver module 200. In addition, a relatively small distance between the demultiplexer 224, the array of photodiodes 226 and the TIAs 228-1, 228-2 may advantageously reduce the overall number of wire bonds and the length of those wire bonds relative to other approaches, e.g., approaches that utilize separate and distinct ROSA housings. Accordingly, increased RF signaling speed and up to 2 db of increased power may result, as well as a reduction in the likelihood of component damage during manufacturing as fewer wire bonds may be utilized for electrical interconnect purposes.

In an embodiment, the array of photodiodes 226 may comprise two 1×4 arrays of photodiodes. In particular, the array of photodiodes 226 can include first 1×4 array of photodoides mounted on a first photodiode submount 256-1 and a second 1×4 array of photodiodes mounted on a second photodiode submount 256-2, which are more clearly shown in FIG. 4. Note, in an embodiment a single-piece submount may be utilized to mount the photodiode array, e.g., to provide a single-piece 1×8 array, as discussed further below with reference to FIGS. 8A-8C. Each of the first and second photodiode submounts 256-1 and 256-2 may be mounted to the first mounting surface 245 of the substrate 202. Each of the first and second photodiode submounts 256-1 and 256-2 may therefore be in thermal communication with the substrate 202.

The optical fiber receptacle 210 may be configured to receive a fiber via a ferrule (not shown). The intermediate waveguide 211, e.g., an optical fiber, optically couples the optical fiber receptacle 210 to the demultiplexer 224 by way of an input port 225. The input port 225, or input coupling section, may be angled relative to the demultiplexer 224, e.g., at about 8 degrees, to reduce back reflection. The optical demultiplexer 224 may comprise, for example, an arrayed waveguide grating (AWG). The optical demultiplexer 224 can demultiplex multiple channel wavelengths from an optical signal and includes an angled surface to direct light along a light path 255 (FIG. 5) that extends substantially parallel with the longitudinal axis 250 towards the substrate 202.

Figure 5:
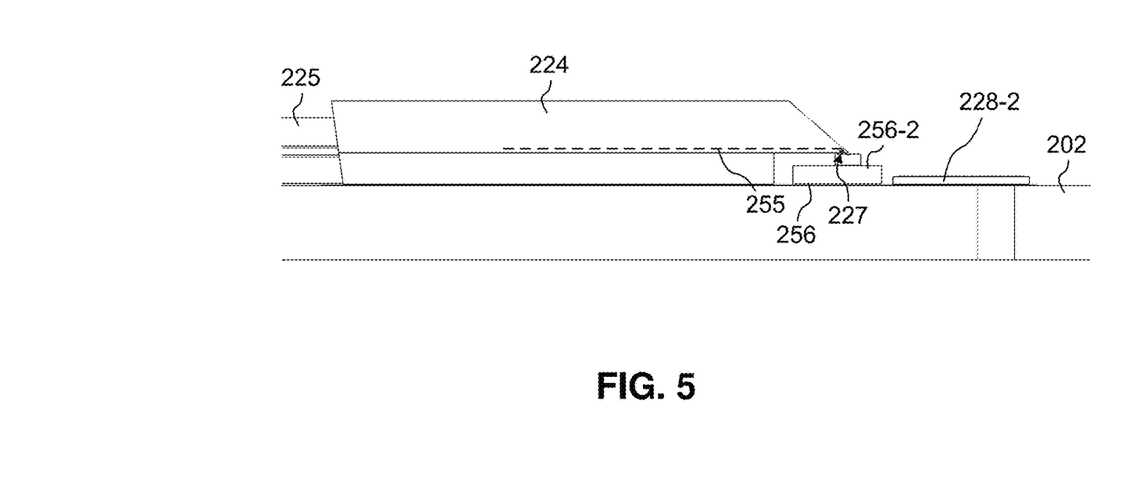
FIG. 5 shows a side-view of an on-board ROSA arrangement of FIG. 4, in accordance with an embodiment.
Figure 6:
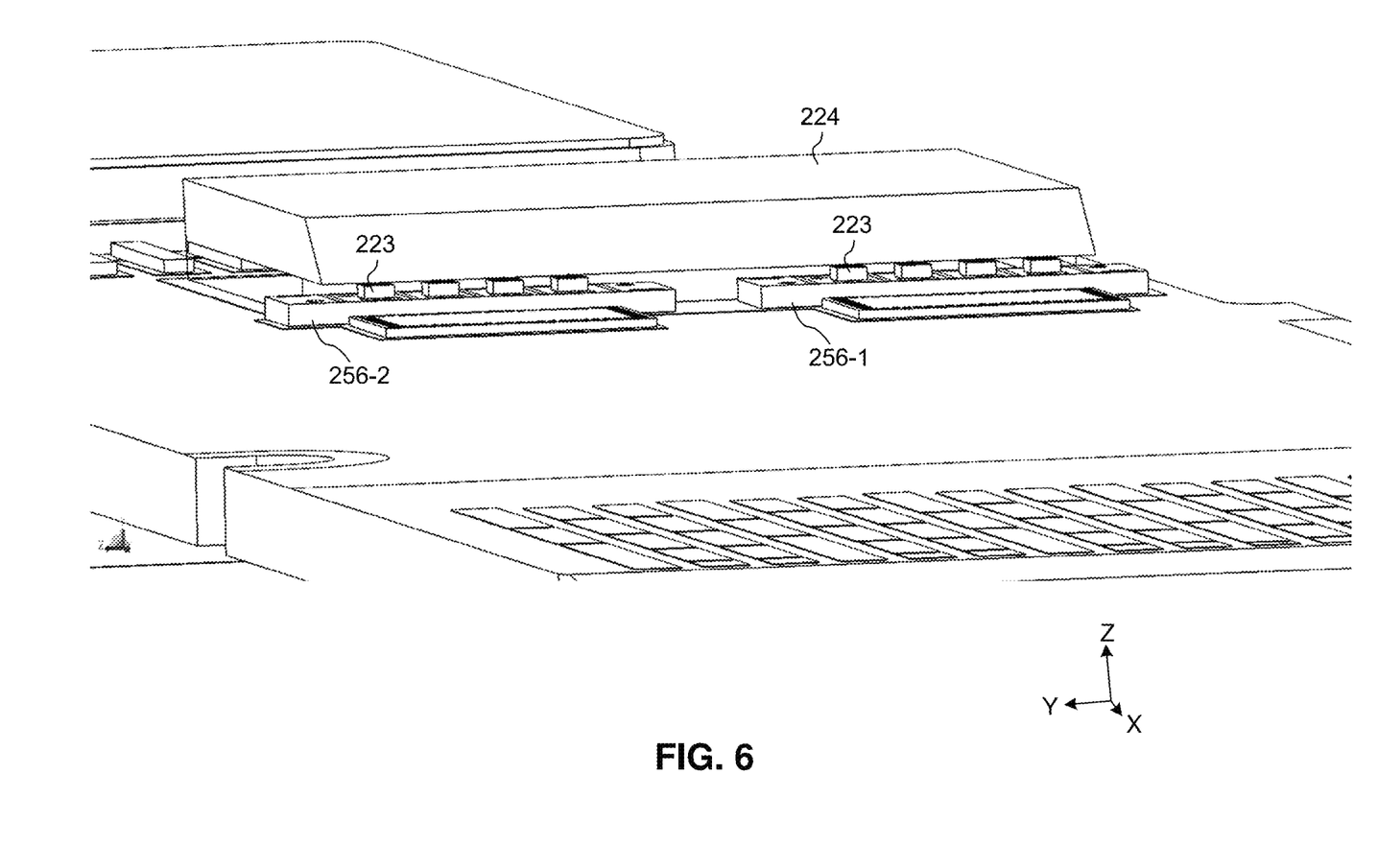
FIG. 6 shows another perspective view of the on-board ROSA arrangement of FIG. 4, in accordance with an embodiment.

Continuing on, an output port 227 of the optical demultiplexer 224 may be optically aligned with the array of photodiodes 226 such that separated channel wavelengths may be launched onto the array of photodiodes 226, which is shown more clearly in FIGS. 5 and 6. During manufacturing, the AWG 224 may be formed via, for instance, a semiconductor process such as photolithography that results in a tolerance of ±0.5 microns. Each of the photodiode devices 223 may be coupled to respective ones of the first or second photodiode submounts 256-1, 256-2 via, for example, die bonding or other suitable method. In turn, the photodiodes submounts 256-1, 256-2 may be coupled to the substrate 202 via, for example, die bonding which has a resulting tolerance of about ±10 microns, for example. During the mounting of the photodiode submounts 256-1, 256-2 the same may be aligned along the X and Y axis to ensure that the optical output ports 227 are aligned with respective ones of the photodiode devices 223.

Photodiode devices such as photodiodes 223 include a light-receiving or light-sensitive region of about 20 microns. Light detected on that region can be converted into an electrical current and a signal representative of that current may be output by each photodiode 223. Light that falls outside of this light-sensing region, e.g., due to misalignment, can result in a degraded or unusable output signal from each photodiode 223.

Figure 7A:
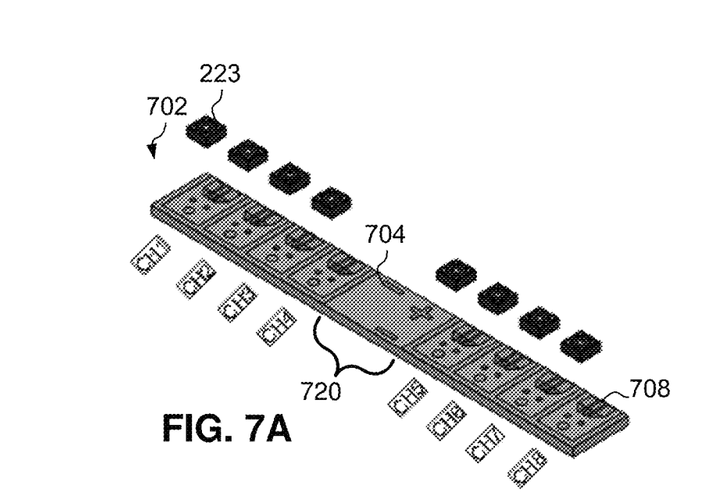
FIGS. 7A-7B show an example photodiode array suitable for use in the on-board ROSA arrangement of FIG. 4, in accordance with an embodiment.
Figure 7B:
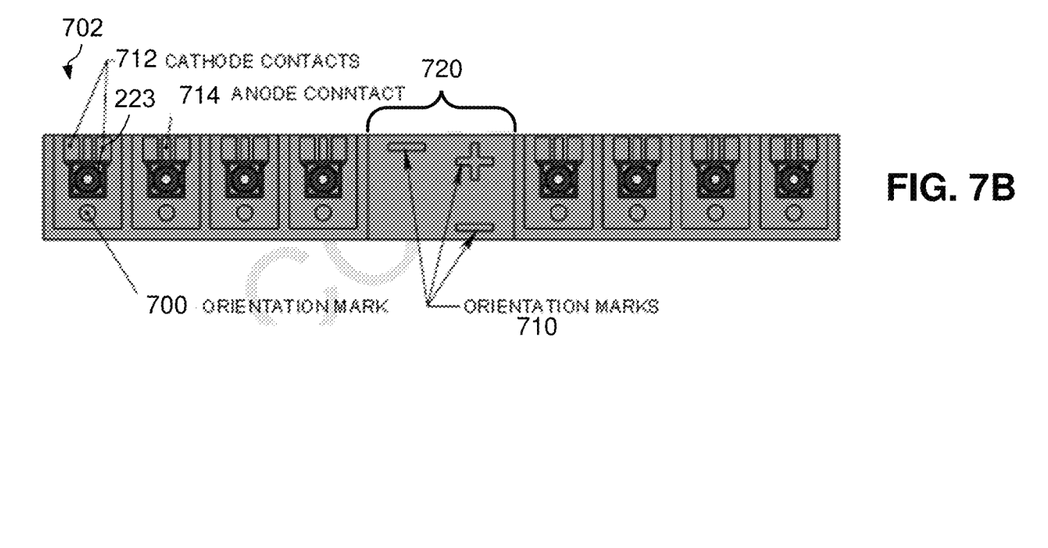

Thus, in an embodiment, each of the photodiodes devices 223 include an integrated lens on one side. For example, FIGS. 7A and 7B show an exploded and assembled photodiode submount 702. Note, the photodiode submount 702 is shown as a single-piece. On the other hand, the photodiode submounts 256-1 and 256-2 of the optical transceiver module 200 are shown as two separate and distinct submounts. Either configuration, e.g., multi or single-piece submounts, may be utilized and are within the scope of this disclosure. The advantageous of multi-piece photodiode submounts include fine-tune alignment adjustments for each of the 1×4 arrays individually. A multi-piece photodiode submount, such as shown in FIGS. 7A and 7B, can reduce build time as alignment can be performed simultaneously along the X and Y axis for all of the associated photodiode devices. Aspects and examples disclosed herein are applicable to either configuration.

In any event, the photodiode submount 702 of FIGS. 7A and 7B include a mounting surface 704. The mounting surface includes a plurality of traces disposed thereon for electrically coupling to the photodiode devices 223 to the photodiode submount 702. The mounting surface further includes a plurality of contacts/terminals 708 to securely and electrically couple each photodiode device 223 to a respective set of pads/terminals 708. Each set of contacts/terminals includes two cathode contacts 712 and an anode contact 714 disposed therebetween. Other contact configurations are within the scope of this disclosure. The photodiode submount 702 can further include a spacer section 720. The spacer section 720 may be sized with a predefined width to ensure that each 1×4 array of photodiode devices are separated by a distance that allows the same to align along the output port 227 of the demultiplexer 224. The photodiode submount 702 may further include orientation marks 710 for alignment purposes.

Figure 8A:
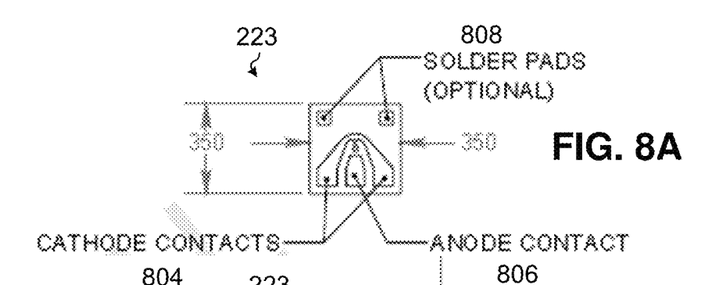
FIGS. 8A-8C collectively show a photodiode with integrated lens suitable for use in the photodiode array of FIGS. 7A-7B, in accordance with an embodiment.
Figures 8B, 8C:
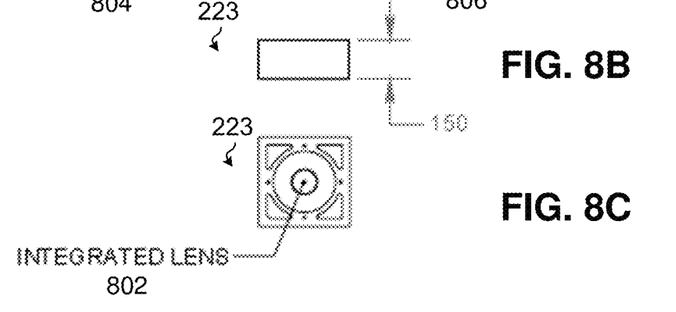

FIGS. 8A-8C show an example of a photodiode device 223 in isolation. As shown in FIG. 8A, a first side of the photodiode device 223 includes a plurality of cathode contacts 804, an anode contact 806, and optional solder pads 808. Opposite the first side, a second side of the photodiode device 223 includes an integrated lens 802. Thus, the photodiode device 223 may be formed as a single, monolithic device with the integrated lens 802 being flush, or substantially flush, with a top surface defining the photodiode device 223. The integrated lens covers at least a portion of the light-sensitive region of the photodiode device 223 and can increase the tolerance up to 50% or more by virtue of its position relative to an associated light-sensitive region. For example, photodiode die bonding can have a ±10 micron tolerance, and the alignment tolerance of a demultiplexer, such as an AWG, can be ±7 microns for a photodiode with a 20 micron light-sensitive region. Without an integrated lens consistent with the present disclosure, optical alignment between a demultiplexer and photodiode may be difficult to achieve consistently with die bonding. Thus, a photodiode with an integrated lens provides an alignment tolerance between the demultiplexer and the photodiode that is increased/enhanced, e.g., to about ±20 microns in cases where the photodiode has a 20 micron light sensitive region. This advantageously allows for a demultiplexer to be used in a ROSA arrangement as disclosed herein, even when there are relatively large disparities in associated tolerances.

The photodiode device 223 may then be coupled to a respective photodiode submount, e.g., photodiode submount 702, with the side having the integrated lens 802 facing away from the photodiode submount. This arrangement of the integrated lens on the photodiode device 223 may be accurately referred to as a backside lens.

In accordance with an aspect of the present disclosure an optical transceiver module is disclosed. The optical transceiver module comprising a substrate having a first end that extends to a second end, the substrate having at least a first mounting surface, and an on-board receiver optical subassembly (ROSA) arrangement, the on-board ROSA arrangement comprising an array of photodiodes mounted to the first mounting surface of the substrate, an optical demultiplexer mounted to the first mounting surface of the substrate, the optical demultiplexer having an optical output port aligned and optically coupled to the array of photodiodes, and wherein each photodiode of the array of photodiodes include an integrated lens to increase an alignment tolerance between the optical demultiplexer and a light sensitive region of each photodiode of the array of photodiodes.

In accordance with another aspect of the present disclosure an optical transceiver is disclosed. The optical transceiver including a housing defining a cavity for receiving an optical transceiver module, and an optical transceiver module disposed at least partially within the cavity of the housing, the optical transceiver module comprising a substrate having a first end that extends to a second end, the substrate having at least a first mounting surface, an on-board receiver optical subassembly (ROSA) arrangement, the on-board ROSA arrangement comprising an array of photodiodes mounted to the first mounting surface of the substrate, an arrayed waveguide grating (AWG) mounted to the first mounting surface of the substrate, the AWG having an optical output port aligned and optically coupled to the array of photodiodes, and wherein each photodiode of the array of photodiodes include an integrated lens to increase an alignment tolerance between the AWG and a light sensitive region of each photodiode of the array of photodiodes, and a transmitter optical subassembly (TOSA) arrangement mounted to the substrate.

In accordance with yet another aspect of the present disclosure a photodiode device for use in an optical subassembly is disclosed. The photodiode device comprising a base having at least first and seconds sides opposite each other, a plurality of electrical contacts disposed on the first side, a light-sensitive region, and an integrated lens disposed proximate the second side over the light-sensitive region to increase an alignment tolerance between an optical demultiplexer and the light-sensitive region of the photodiode.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. An optical transceiver module, the optical transceiver module comprising:
   a substrate having a first end that extends to a second end, the substrate having at least a first mounting surface; and
   an on-board receiver optical subassembly (ROSA) arrangement, the on-board ROSA arrangement comprising:
      an array of photodiodes mounted to the first mounting surface of the substrate;
      an optical demultiplexer mounted to the first mounting surface of the substrate, the optical demultiplexer having an optical output port aligned and optically coupled to the array of photodiodes; and
      wherein each photodiode of the array of photodiodes include an integrated lens disposed thereon such that the integrated lens is substantially flush with a top surface defining each photodiode to increase an alignment tolerance between the optical demultiplexer and a light sensitive region of each photodiode of the array of photodiodes.

2. The optical transceiver module of claim 1, wherein the optical demultiplexer is configured to receive a signal having multiple channel wavelengths and output at least five different channel wavelengths.

3. The optical transceiver module of claim 1, wherein the array of photodiodes are mounted to the first mounting surface by way of a photodiode submount.

4. The optical transceiver module of claim 3, wherein the array of photodiodes include first and second 1×4 arrays of photodiodes, and wherein the photodiode submount is configured to couple to the first and second 1×4 arrays of photodiodes, and wherein the photodiode submount is formed as a single piece and includes a spacer that separates the first and second 1×4 arrays by a distance that aligns each of the first and second 1×4 arrays of photodiodes with associated output ports of the optical demultiplexer.

5. The optical transceiver module of claim 1, further comprising first and second amplification circuits mounted to the first mounting surface of the substrate, the first and second amplification circuits electrically coupled to the array of photodiodes.

6. The optical transceiver module of claim 1, wherein the optical demultiplexer comprises an arrayed waveguide grating (AWG).

7. The optical transceiver module of claim 1, wherein each photodiode of the array of photodiodes provides the increased alignment tolerance based on a position of a lens integrated into each photodiode.

8. The optical transceiver module of claim 1, wherein the substrate comprises a printed circuit board assembly (PCBA).

9. An optical transceiver, the optical transceiver comprising:
a housing defining a cavity for receiving an optical transceiver module; and
an optical transceiver module disposed at least partially within the cavity of the housing, the optical transceiver module comprising:
a substrate having a first end that extends to a second end, the substrate having at least a first mounting surface;
an on-board receiver optical subassembly (ROSA) arrangement, the on-board ROSA arrangement comprising:
an array of photodiodes mounted to the first mounting surface of the substrate;
an arrayed waveguide grating (AWG) mounted to the first mounting surface of the substrate, the AWG having an optical output port aligned and optically coupled to the array of photodiodes; and
wherein each photodiode of the array of photodiodes include an integrated lens disposed thereon such that the integrated lens is substantially flush with a top surface defining each photodiode to increase an alignment tolerance between the AWG and a light sensitive region of each photodiode of the array of photodiodes;
a transmitter optical subassembly (TOSA) arrangement mounted to the substrate.

10. The optical transceiver of claim 9, wherein the AWG is configured to receive a signal having multiple channel wavelengths and output at least five different channel wavelengths.

11. The optical transceiver of claim 9, wherein the array of photodiodes are mounted to the first mounting surface by way of a photodiode submount.

12. The optical transceiver of claim 11, wherein the array of photodiodes include first and second 1×4 arrays of photodiodes, and wherein the photodiode submount is configured to couple to the first and second 1×4 arrays of photodiodes and includes a spacer that separates the first and second 1×4 arrays of photodiodes by a distance that aligns each of the first and second 1×4 arrays of photodiodes with associated output ports of the AWG.

13. The optical transceiver of claim 9, further comprising first and second amplification circuits mounted to the first mounting surface of the substrate, the first and second amplification circuits electrically coupled to the array of photodiodes.

14. The optical transceiver of claim 9, wherein the AWG includes a base portion that couples the AWG to the first mounting surface and a body that defines at least one light path for separating channel wavelengths and optically coupling the AWG to the array of photodiodes, the at least one light path not extending through the base portion.

15. The optical transceiver of claim 9, wherein the increased alignment tolerance is based on a position of each integrated lens relative to the light-sensitive region.

16. A photodiode device for use in an optical subassembly, the photodiode device comprising:
a base having at least first and seconds sides opposite each other;
a plurality of electrical contacts disposed on the first side;
a light-sensitive region; and
an integrated lens disposed on the second side over the light-sensitive region such that the integrated lens is substantially flush with a top surface defining each photodiode to increase an alignment tolerance between an optical demultiplexer and the light-sensitive region of the photodiode.

17. The photodiode device of claim 16, wherein the integrated lens at least doubles the alignment tolerance.

* * * * *